United States Patent [19]

Shimizu et al.

[11] Patent Number: 4,649,438
[45] Date of Patent: Mar. 10, 1987

[54] PHASE LOCKED SIGNAL GENERATOR

[75] Inventors: Kyoichi Shimizu; Akira Fujita, both of Yokohama, Japan

[73] Assignee: Victor Company of Japan, Ltd., Yokohama, Japan

[21] Appl. No.: 668,034

[22] Filed: Nov. 5, 1984

[30] Foreign Application Priority Data

Nov. 4, 1983 [JP] Japan .................................. 58-207110

[51] Int. Cl.⁴ .......................... H04N 5/78; H03L 7/00
[52] U.S. Cl. .................................. 358/337; 360/36.2; 360/37.1; 331/20
[58] Field of Search .................. 331/20; 358/310, 319, 358/320, 323, 324, 325, 326, 150, 148, 149, 159, 337; 360/36.1, 36.2, 37.1, 33.1

[56] References Cited

U.S. PATENT DOCUMENTS 3,920,901 11/1975 Boehly et al. ........................ 358/150
4,536,793 8/1985 Harshbarger et al. ............... 358/319

Primary Examiner—Donald McElheny, Jr.
Attorney, Agent, or Firm—Roberts, Spiecens & Cohen

[57] ABSTRACT

A phase locked signal generator comprises an asynchronous oscillator for producing a square wave signal, delay circuits supplied with the output square wave signal of the asynchronous oscillator, which delay circuits are provided in a plurality of stages and the output square wave signal of the asynchronous oscillator is supplied to a delay circuit provided in an initial stage, a latch circuit supplied with the output square wave signal of the asynchronous oscillator and outputs of the delay circuits, which latch circuit simultaneously latches the outputs of the delay circuits responsive to a reference signal applied to the latch circuit, and a gate circuit for producing an input or an output of one or a plurality of delay circuits each having an input and an output of mutually opposite polarities at a time when the reference signal is applied to the latch circuit, as an output square wave signal of the phase locked signal generator.

10 Claims, 8 Drawing Figures

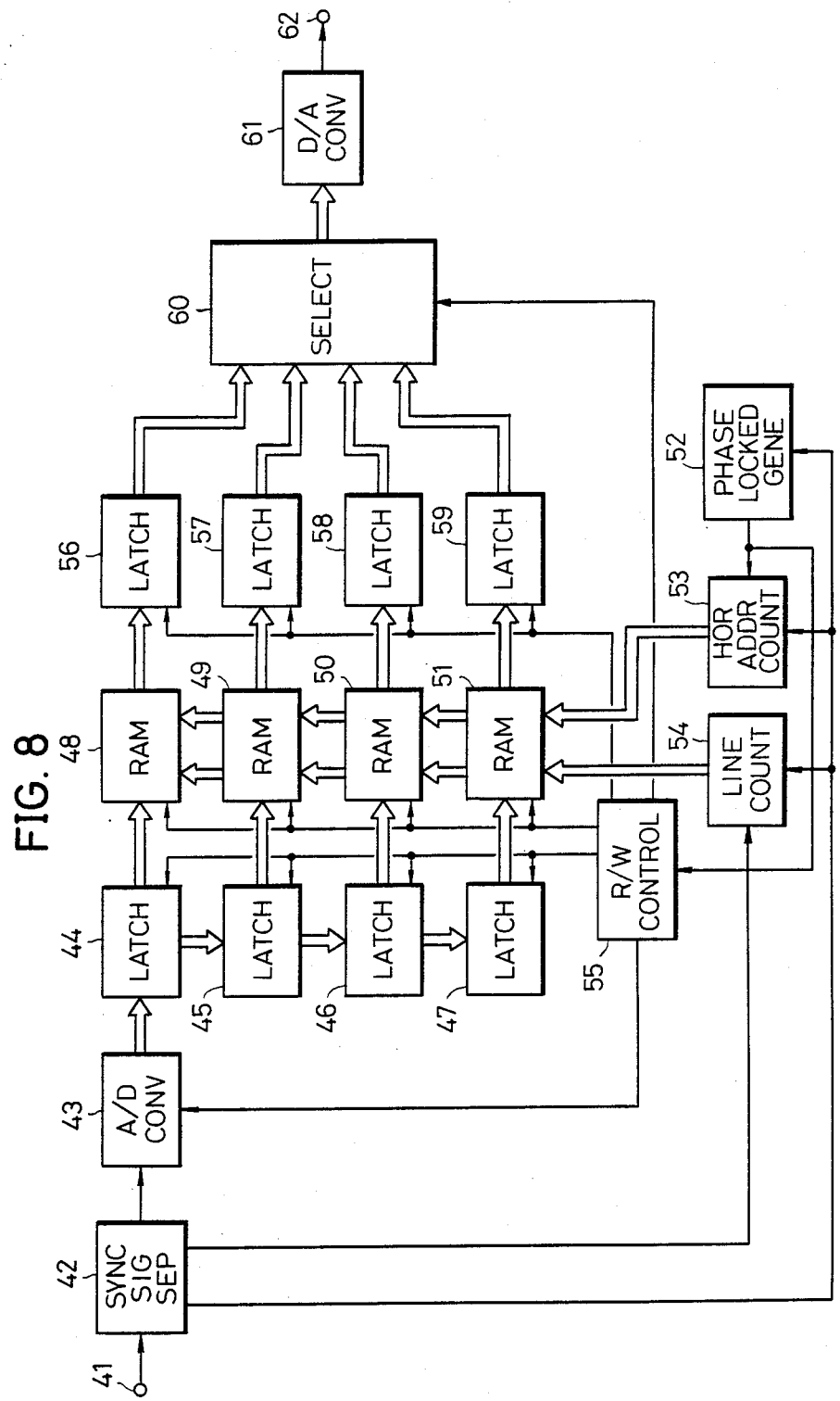

PHASE LOCKED SIGNAL GENERATOR

BACKGROUND OF THE INVENTION (a) Field of the Invention

The present invention generally relates to phase locked generators, and more particularly to a phase locked signal generator for generating a square wave signal with a predetermined phase in phase synchronism with (phase locked to) an incoming reference signal which is independent of the period and phase of the square wave signal which is generated from the phase locked signal generator.

(b) Description of Prior Art

Recently, write-in and read-out of a video signal is performed by coupling a digital picture processing apparatus to a video signal recording and reproducing apparatus (hereinafter simply referred to as a VTR). The video signal which is recorded in the VTR, is written into and read out from the digital picture processing apparatus in synchronism with the VTR. In this case, a write-in clock signal or a read-out clock signal which is used to write in or read out the digital picture element information, is phase synchronized with (phase locked to) a horizontal synchronizing signal of the video signal. When one digital picture element information corresponds to one clock pulse of an access clock signal which is used to make access to the digital picture element information, several hundred clock pulses are required with respect to one horizontal scanning line, for example, As a conventional phase locked signal generator for generating an access clock signal which is phase locked to a reference signal (for example, the horizontal synchronizing signal of the video signal), there is a conventional phase locked signal generator which employs a phase locked loop (PLL). This conventional phase locked signal generator generally comprises a voltage controlled oscillator (VCO), a frequency divider, and a phase comparator. The VCO has an output oscillation frequency which is M times the frequency of the reference signal, where M is an integer. The output oscillation frequency of the VCO is frequency-divided by 1/M in the frequency divider, and an output of the frequency divider is supplied to the phase comparator. The phase comparator compares the phase of the output of the frequency divider with the phase of the reference signal, and supplies an output error voltage to the VCO so as to control the output oscillation frequency of the VCO. The output of the VCO is produced as a clock signal which is phase locked to the reference signal.

However, a horizontal synchronizing signal within a reproduced signal which is obtained from the VTR, constantly includes a jitter. Thus, when such a horizontal synchronizing signal including the jitter is used as the reference signal in the above conventional phase locked signal generator, the phase of the clock signal which is generated from the phase locked signal generator, constantly follows the jitter included in the horizontal synchronizing signal for every period of the horizontal synchronizing signal. Hence, according to the phase locked signal generator employing the PLL, it is impossible to obtain a clock signal having accurate instantaneous phase and frequency, although the phase and frequency are accurate from a statistical viewpoint. For this reason, when the clock signal generated from this conventional phase locked signal generator is used as the access clock signal of the digital picture processing apparatus, the recorded or reproduced picture becomes irregular in the horizontal direction of the picture for every horizontal scanning line. In other words, in the case of the reproduced picture, a straight line which should appear vertical line in the picture may become distorted, for example.

On the other hand, as another example of a conventional phase locked signal generator, there is a phase locked signal generator which assumes a free-running state (asynchronous state) until a reference signal is applied thereto. This conventional phase locked signal generator generates a clock signal which is phase locked to the reference signal, by re-starting the clock signal generation from the time when the reference signal is applied thereto. After the phase locked signal generator re-starts, a clock signal having a constant period is obtained from the phase locked signal generator. Hence, even when the reference signal is a horizontal synchronizing signal including a jitter and the clock pulse is used as the access clock signal of the digital picture processing apparatus, the problem of irregularity in the horizontal direction of the reproduced picture introduced for every horizontal scanning line, is considerably less likely to be introduced compared to the conventional phase locked signal generator which employs the PLL.

However, in the conventional re-start type phase locked signal generator, it is only possible to employ a low-precision oscillator such as an RC oscillator which can change the phase of an output square wave signal responsive to a reference signal by changing the charging timing or the discharge timing of a capacitor. In other words, a high-precision oscillator such as a crystal oscillator which cannot change the phase of an output square wave signal, cannot be employed in the conventional re-start type phase locked signal generator.

As still another example of a conventional phase locked signal generator, there is a phase locked signal generator comprising a crystal oscillator and a counter. An output oscillation frequency of the crystal oscillator is N times the frequency of a desired clock signal, where N is an integer. The counter counts the pulses in the output signal of the crystal oscillator, and essentially frequency-divides the output oscillation frequency of the crystal oscillator by 1/N. The counter is reset by a reference signal, and re-starts the count from the time when the counter is reset. Accordingly, the counter produces a clock signal which is phase locked to the reference signal. However, although the counter produces the clock signal which is phase locked to the reference signal, a phase error is introduced depending on the timing with which the counter is reset. A maximum of this phase error corresponds to one period of the output signal of the crystal oscillator. In order to minimize such a phase error, the output oscillation frequency of the crystal oscillator must be set to a sufficiently high frequency.

However, when the output oscillation frequency of the crystal oscillator is set to a high frequency, a radiation interference is introduced to the outside. Moreover, it becomes difficult to realize the circuit by TTL.

SUMMARY OF THE INVENTION

Accordingly, it is a general object of the present invention to provide a novel and useful phase locked signal generator in which the problems described heretofore are eliminated.

Another and more specific object of the present invention is to provide a phase locked signal generator comprising a high-precision oscillator, delay means, latch means, and gate means. The delay means comprises a plurality of delay circuits provided in respective stages, and an output square wave signal of the oscillator is supplied to the delay circuit which is provided in the initial stage. The latch means latches input and output of each of the delay circuits responsive to a reference signal. The gate means is supplied with the output of each of the delay circuits and outputs of the latch means. The gate means produces as an output signal of the phase locked signal generator, an output of a delay circuit which has input and output of mutually different polarities at the time when the reference signal is supplied to the latch means. According to the phase locked signal generator of the present invention, it is possible to obtain an output signal which is accurately phase locked to the reference signal.

Other objects and further features of the present invention will be apparent from the following detailed description when read in conjunction with the acompanying drawings.

BRIEF DESCRIPTION OF THE DRAWINGS

FIG. 8 is a general systematic block diagram showing a case where the phase locked signal generator according to the present invention is applied to a digital picture element information write-in and read-out system.

DETAILED DESCRIPTION

Figure 1:
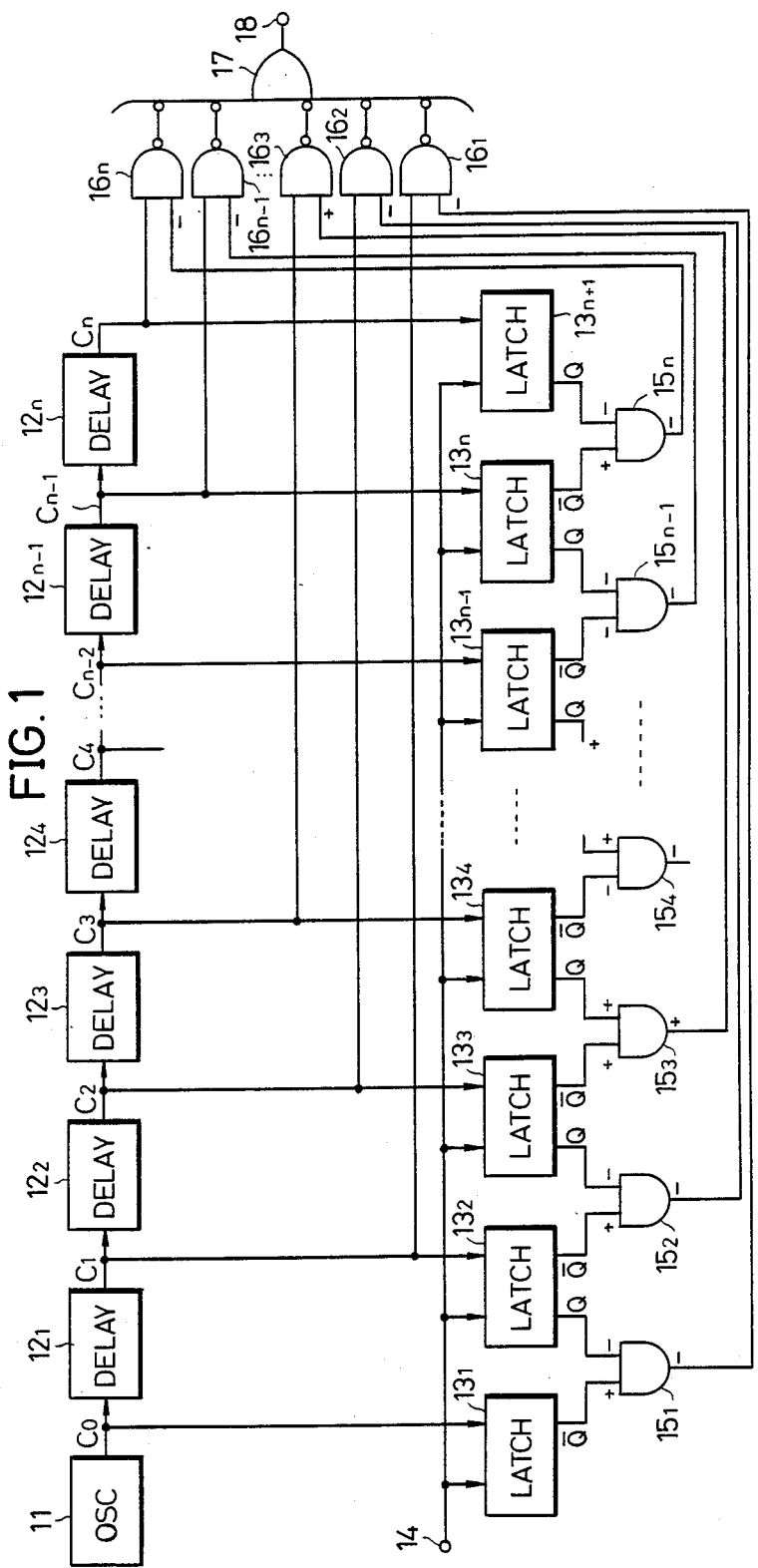
FIG. 1 is a circuit diagram showing a first embodiment of a phase locked signal generator according to the present invention.

A first embodiment of a phase locked signal generator according to the present invention, is shown in FIG. 1. In FIG. 1, an oscillator 11 is a high-precision oscillator such as a crystal oscillator, and produces a square wave signal having a frequency f (Hz). The frequency f is equal to an output signal frequency of the phase locked signal generator, and is set to 9.63 MHz, for example. The output square wave signal of the oscillator 11 is successively supplied to delay circuits $12_1$ through $12_n$ provided in n stages, where n is an integer. Each of the delay circuits $12_1$ through $12_n$ has a delay time $t_1$. The delay time $t_1$ is set to a value which is sufficiently small compared to one period of the output square wave signal of the oscillator 11, and is equal to 6.7 nsec., for example.

Each of latch circuits $13_1$ through $13_{n+1}$ has a latch delay time $t_2$, and $t_2$ is equal to $t_1/2$, for example. The latch circuit $13_1$ is supplied with the output square wave signal of the oscillator 11 which is obtained through a point $C_0$, and the latch circuits $13_2$ through $13_{n+1}$ are supplied with output signals of the respective delay circuits $12_1$ through $12_n$ which are obtained through respective points $C_1$ through $C_n$. In other words, a latch circuit $13_i$ is supplied with an output signal of a delay circuit $12_{i-1}$, where i is an arbitrary integer and i=2, 3, ..., n+1. The input signals of the latch circuits $13_1$ through $13_{n+1}$ are respectively and simultaneously latched responsive to a reference signal which is applied to an input termnal 14. A $\overline{Q}$-output of the latch circuit $13_1$ and a Q-output of the latch circuit $13_2$ are supplied to an AND circuit $15_1$. A $\overline{Q}$-output of the latch circuit $13_2$ and a Q-output of the latch circuit $13_3$ are supplied to an AND circuit $15_2$. Similarly, a $\overline{Q}$-output and a Q-output of two mutually adjacent latch circuits among the latch circuits $13_3$ through $13_{n+1}$, that is, a $\overline{Q}$-output of a latch circuit $13_{i-1}$ and a Q-output of a latch circuit $13_i$, are supplied to an AND circuit $15_{i-1}$. Each of the AND circuits $15_1$ through $15_n$ has a gate delay time $t_3$, and $t_3$ is equal to $t_1/2$, for example.

An output of the AND circuit $15_1$ and the output of the delay circuit $12_1$ are supplied to a NAND circuit $16_1$. An output of the AND circuit $15_2$ and the output of the delay circuit $12_2$ are supplied to a NAND circuit $16_2$. Similarly, an output of an AND circuit $15_{i-1}$ and an output of a delay circuit $12_{i-1}$ are supplied to a NAND circuit $16_{i-1}$. Outputs of the NAND circuits $16_1$ through $16_n$ are supplied to a negative polarity input OR circuit 17, and an output of the OR circuit 17 is obtained through an output terminal 18.

Figure 2:
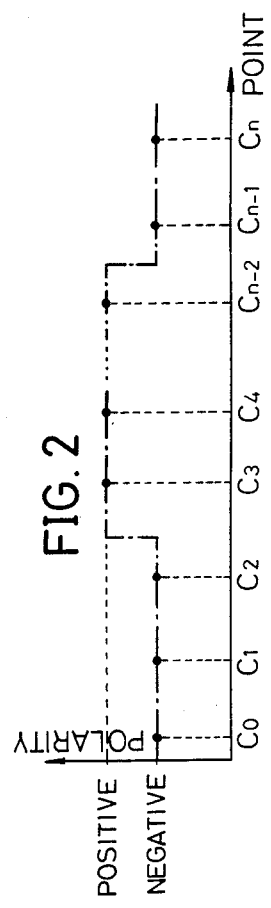
FIG. 2 is a diagram showing input and output polarities of delay circuits at a time when a reference signal is applied to an input terminal 14.
Figure 3:
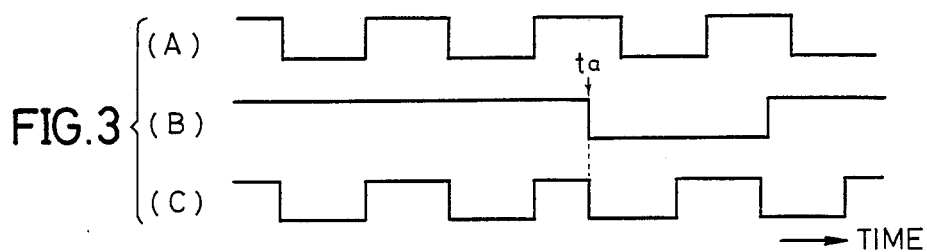
FIGS. 3(A) through 3(C) are graphs showing signal waveforms of an output of an oscillator within the phase locked signal generator shown in FIG. 1, the reference signal, and an output signal of the phase locked signal generator.
Figure 4:
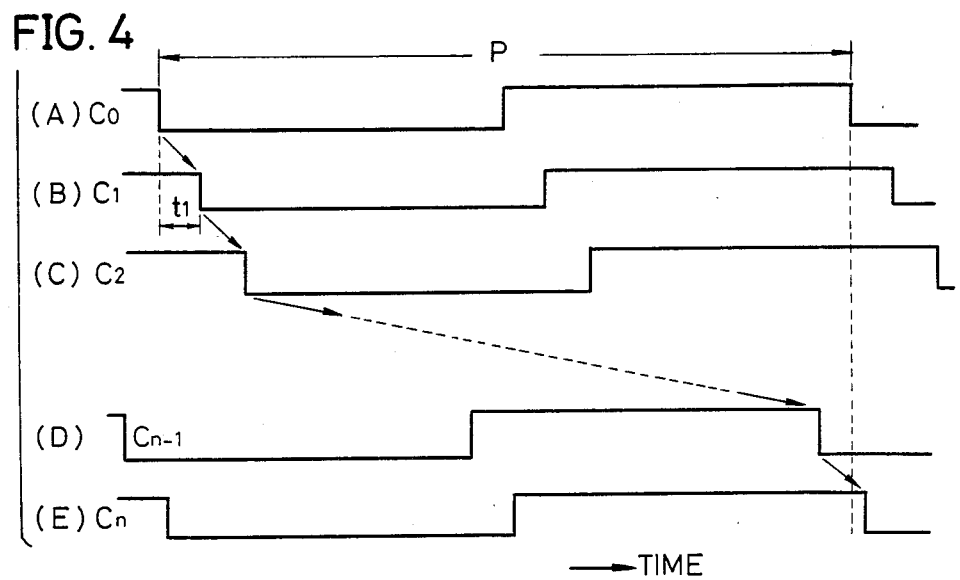
FIGS. 4(A) through 4(E) are graphs showing input and output signals of delay circuits within the phase locked signal generator shown in FIG. 1.

Next, description will be given with respect to the operation of the phase locked signal generator shown in FIG. 1 by referring to FIGS. 2 through 4.

The oscillator 11 produces a square wave signal shown in FIG. 3(A) having a frequency f (Hz). When a period P of the output square wave signal of the oscillator 11 is set to a value which is smaller than a total time T (=$nt_1$) of the delay times $t_1$ in each of the delay circuits $12_1$ through $12_n$, the relationship between the output square wave signal of the oscillator 11 obtained at the point $C_0$ and the outputs of the delay circuits $12_1$ through $12_n$ obtained at points $C_1$ through $C_n$, becomes as shown in FIGS. 4(A) through 4(E).

When it is assumed that a reference signal shown in FIG. 3(B) is applied to the input terminal 14 at a time $t_a$, the signals obtained through the points $C_0$ through $C_n$ are simultaneously latched in the respective latch circuits $13_1$ through $13_{n+1}$. Accordingly, in a case where the reference signal is applied to the input terminal 14 at the time $t_a$ when the polarities of the signals at the points $C_0$ through $C_2$ are negative, the polarities of the signals at the points $C_3$ through $C_{n-2}$ are positive, and the polarities of the signals at the points $C_{n-1}$ and $C_n$ are negative as shown in FIG. 2, Q-outputs of the latch circuits $13_1$ through $13_3$ each assumes a negative polarity, Q-outputs of the latch circuits $13_4$ through $13_{n-1}$ each assumes a positive polarity, and Q-outputs of the latch circuits $13_n$ and $13_{n+1}$ each assumes a negative polarity after the latch delay time $t_2$ elapses from the time $t_a$. The polarities of the Q-outputs of the latch circuits $13_1$ through $13_{n+1}$ are maintained until a subsequent reference signal is applied to the input terminal 14, and the $\overline{Q}$-outputs and the Q-outputs of the latch circuits $13_1$ through $13_{n+1}$ are supplied to the AND circuits $15_1$ through $15_n$.

Because the total time T ($=nt_1$) of the delay times $t_1$ in each of the delay circuits $12_1$ through $12_n$ is set to a value which is larger than the period P of the output square wave signal of the oscillator 11, there is at least one signal transition from negative polarity to positive polarity at one of the points $C_0$ through $C_n$ at the time $t_a$ when the reference signal is applied to the input terminal 14. In the present embodiemtn, the polarity of the signal at the point $C_2$ is negative but the polarity of the signal at the point $C_3$ is positive as shown in FIG. 2, and there is a signal transition from negative polarity to positive polarity between the points $C_2$ and $C_3$.

An AND circuit $15_{i-1}$ performs and AND operation between a $\overline{Q}$-output of a latch circuit $13_{i-1}$ and a Q-output of a latch circuit $13_i$. Hence, in the present embodiment, only the AND circuit $15_3$ which performs an AND operation between the $\overline{Q}$-output (positive polarity) of the latch circuit $13_3$ and the Q-output (positive polarity) of the latch circuit $13_4$, produces a positive polarity output. The remaining AND circuits $15_1$, $15_2$, and $15_4$ through $15_n$ all produce negative polarity outputs. A NAND circuit $16_{i-1}$ performs a NAND operation between an output of an AND circuit $15_{i-1}$ and an output of a delay circuit $12_{i-1}$. However, since the AND circuits $15_1$, $15_2$, and $15_4$ through $15_n$ all produce negative polarity outputs, the NAND circuits $16_1$, $16_2$, and $16_4$ through $16_n$ are not turned ON. On the other hand, the NAND circuit $16_3$ which performs a NAND operation between the positive polarity output of the AND circuit $15_3$ and the output of the delay circuit $12_3$, is turned ON during a time period in which the output of the delay circuit $12_3$ assumes a positive polarity. Because the positive polarity output of the AND circuit $15_3$ does not change until a subsequent reference signal is applied to the input terminal 14, the OR circuit 17 produces the output of the NAND circuit $16_3$, that is, the output of the delay circuit $12_3$, through the output terminal 18. Thus, a square wave signal shown in FIG. 3(C) is produced from the phase locked signal generator from the time $t_a$.

When a subsequent reference signal is applied to the input terminal 14 at a time $t_b$ when the polarities of the signals at the points $C_0$ and $C_1$ are negative, the polarities of the signals at the points $C_2$ through $C_{n-3}$ are positive, and the polarities of the signals at the points $C_{n-2}$ through $C_n$ are negative, only the AND circuit $15_2$ produces a positive polarity output. Accordingly, in this case, the OR circuit 17 produces the output of the delay circuit $12_2$.

Therefore, the signal obtained through the output terminal 18 when the reference signal is applied to the input terminal 14, is the output of the delay circuit which has a negative polarity input and a positive polarity output among the delay circuits $12_1$ through $12_n$. In other words, the phase of the output square wave signal of the oscillator 11 is shifted in phase synchronism with the output of the delay circuit having a phase which is inverted at the time when the reference signal is applied to the input terminal 14. Thus, a square wave signal which is accurately phase locked to the reference signal, is obtained through the output terminal 18.

According to the present embodiment, the period of the output square wave signal produced from the phase locked signal generator, is constant after the reference signal is applied to the input terminal 14. Accordingly, even in a case where the reference signal is a horizontal synchronizing signal within a reproduced signal which is obtained from a VTR and includes a jitter, for example, the output square wave signal of the phases locked signal generator will not constantly follow the jitter included in the reference signal with a time delay for every period of the reference signal as in the case of the conventional phase locked signal generator described before which employs the PLL. In addition, when the present embodiment is applied to a digital picture element information write-in and read-out system, the recorded or reproduced picture will not become irregular in the horizontal direction of the picture for every horizontal scanning line as in the case of the conventional phase locked signal generator which employs the PLL.

Further, the frequency f of the output square wave signal of the oscillator 11 is equal to the frequency of the output square wave signal of the phase locked signal generator. For this reason, no radiation interference is introduced to the outside as in the case of the conventional phase locked signal generator described before which employs the crystal oscillator having an output oscillation frequency which is N times the desired clock signal frequency. Moreover, according to the present embodiment, the circuit can be realized by TTL when the present embodiment is to be applied to the digital picture element information write-in and read-out system, for example.

Next, description will be given with respect to the relationship between the delay time $t_1$ of each of the delay circuits $12_1$ through $12_n$, the latch delay time $t_2$ of each of the latch circuits $13_1$ through $13_{n+1}$, and the gate delay time $t_3$ of each of the AND circuits $15_1$ through $15_n$.

In a case where a relation $t_1 = t_2 + t_3$ stands, the timing with which the NAND circuits $16_1$ through $16_n$ are selectively turned ON and the timing with which the phases of the outputs of the delay circuits $12_1$ through $12_n$ change when the reference signal is applied to the input terminal 14, coincide. Hence, the output square wave signal which is obtained through the output terminal 18 is accurately phase locked to the reference signal, and there is no phase lock error.

On the other hand, in a case where a relation $t_1 < t_2 + t_3$ stands, where $t_1 \approx t_2 \approx t_3$, the timing with which the NAND circuits $16_1$ through $16_n$ are selectively turned ON and the timing with which the phases of the outputs of the delay circuits $12_1$ through $12_n$ change when the reference signal is applied to the input terminal 14, do not coincide. In other words, the NAND circuits $16_1$ through $16_n$ are selectively turned ON after the phases of the ouputs of the delay circuits $12_1$ through $12_n$ change. Accordingly, in this case, the first one period of the output signal of the OR circuit 17 becomes shorter than the period of the output signal obtained thereafter, and a constant phase lock error occurs. In order to reduce this constant phase lock error, measures may be taken so that a relation $2t_1 = t_2 + t_3$ stands, for example. The relation $2t_1 = t_2 + t_3$ will stand when an output of an AND circuit $15_{i-2}$ is supplied to a NAND circuit $16_{i-1}$, for example, instead of supplying an output of an AND circuit $15_{i-1}$ to a NAND circuit $16_{i-1}$ as shown in FIG. 1.

In a case where a relation $t_1 > t_2 + t_3$ stands, the phases of the outputs of the delay circuits $12_1$ through $12_n$ change after the NAND circuits $16_1$ through $16_n$ are selectively turned ON. Accordingly, in this case, the first one period of the output signal of the OR circuit 17 becomes longer than the period of the output signal obtained thereafter, and a constant phase lock error occurs. In order to reduce this constant phase lock error, an output of the AND circuit $15_{i-1}$ may be supplied to a NAND circuit $16_{i-2}$, for example, instead of supplying an output of an AND circuit $15_{i-1}$ to a NAND circuit $16_{i-1}$ as shown in FIG. 1.

Therefore, in cases where the relation $t_1=t_2+t_3$ does not stand, the constant phase lock error can be reduced by appropriately changing the connections between the outputs of the AND circuits $15_1$ through $15_n$ and the inputs of the NAND circuits $16_1$ through $16_n$, instead of controlling the delay times $t_1$, $t_2$, and $t_3$.

In a case where $T>P$, positive polarity outputs may be obtained from a plurality of AND circuits among the AND circuits $15_1$ through $15_n$, within the period P. However, a plurality of corresponding NAND circuits which are supplied with the positive polarity outputs of the plurality of AND circuits, are also supplied with the outputs of a plurality of corresponding delay circuits which produce outputs having the same signal waveform. For this reason, even when a plurality of NAND circuits are simultaneously turned ON, the output signal of the OR circuit 17 is the same as when only one NAND circuit is turned ON, and no problems are introduced.

When the delay circuits $12_1$ through $12_n$ are constituted by delay elements each having the delay time $t_1$ which easily changes responsive to a temperature change, the total time T of the delay times $t_1$ in each of the delay circuits $12_1$ through $12_n$ will change responsive to the temperature change. However, in the present embodiment, the relation $T>P$ stands, and thus, it is possible to set a large tolerance with respect to the temperature change, and the operation stability of the phase locked signal generator is high.

Figure 5:
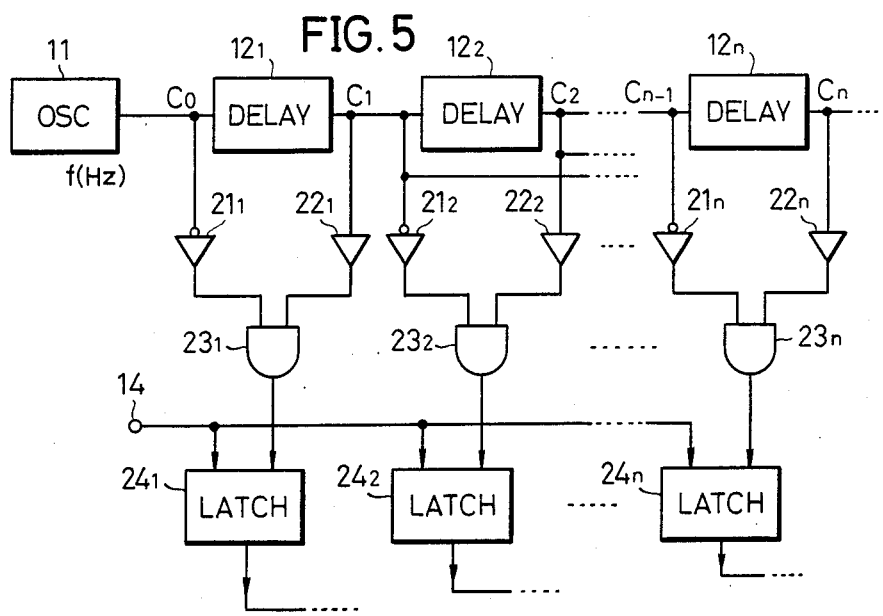
FIG. 5 is a circuit diagram showing an essential part of a second embodiment of a phase locked signal generator according to the present invention.

Next, description will be given with respect to a second embodiment of a phase locked signal generator according to the present invention, by referring to FIG. 5. FIG. 5 shows an essential part of the second embodiment, and in FIG. 5, those parts which are the same as those corresponding parts in FIG. 1 are designated by the same reference numerals and description thereof will be omitted.

In FIG. 5, the delay circuits $12_1$ through $12_n$ are connected to each other in the same manner as in the first embodiment shown in FIG. 1, and succesively delay the output square wave signal of the oscillator 11 by the delay time $t_1$. The output square wave signal of the oscillator 11 which is obtained through the point $C_0$, is inverted in an inverter $21_1$, and is supplied to one input terminal of an AND circuit $23_1$. The output of the delay circuit $12_1$ which is obtained through the point $C_1$ and is passed through a delay equalizer $22_1$, is supplied to the other input terminal of the AND circuit $23_1$. Similarly, an inverter $21_{i-1}$ is supplied with a signal which is obtained through a point $C_{i-2}$, and a delay equalizer $22_{i-1}$ is supplied with a signal which is obtained through a point $C_{i-1}$. An AND circuit $23_{i-1}$ performs an AND operation between an output of an inverter $21_{i-1}$ and an output of a delay equalizer $22_{i-1}$, and supplies an output to a corresponding latch circuit $24_{i-1}$. Although the illustration thereof is omitted in FIG. 5, an output of a latch circuit $24_{i-1}$ is supplied to a NAND circuit $16_{i-1}$, and a NAND circuit $16_{i-1}$ performs a NAND operation between an output of a latch circuit $24_{i-1}$ and an output of a delay circuit $12_{i-1}$. The outputs of the NAND circuits $16_1$ through $16_n$ (not shown in FIG. 5) are supplied to the OR circuit 17 (not shown in FIG. 5), and the output signal of the OR circuit 17 is obtained through the output terminal 18 (not shown in FIG. 5).

In this second embodiment, an input and an output of a delay circuit $12_{i-1}$ are supplied to an AND circuit $23_{i-1}$ with mutually opposite phases, and an output of an AND circuit $23_{i-1}$ is latched in a latch circuit $24_{i-1}$ responsive to the reference signal applied to the input terminal 14. According to this second embodiment, it is possible to obtain a square wave signal which is accurately phase locked to the reference signal, through the output terminal 18, as in the case of the first embodiment described before.

Figure 6:
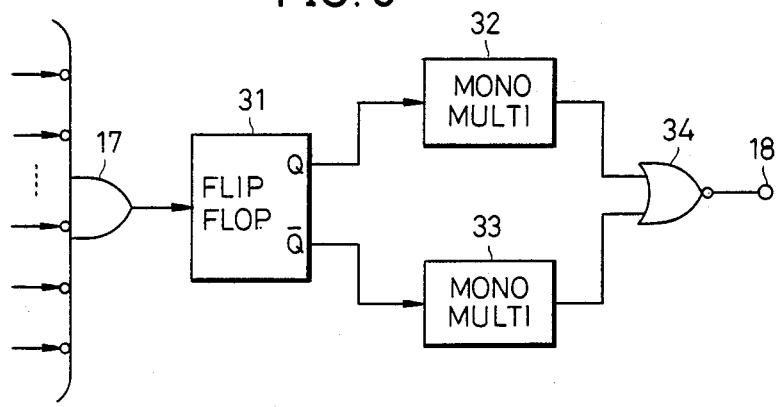
FIG. 6 is a circuit diagram showing an essential part of a modification of the phase locked signal generator according to the present invention.

Next, description will be given with respect to a modification of the phase locked signal generator according to the present invention, by referring to FIG. 6. FIG. 6 shows an essential part of the modification, and in FIG. 6, those parts which are the same as those corresponding parts in FIG. 1 are designated by the same reference numerals and description thereof will be omitted.

When TTL gates are used for the delay circuits $12_1$ through $12_n$ in the first and second embodiments described heretofore, the duty cycle of the output square wave signal which is obtained through the output terminal 18 will not become accurately equal to 50% even when the output square wave signal of the oscillator 11 has a duty cycle of 50%. This is because the delay time of a TTL gate differs slightly with respect to a rise in the input signal and a fall in the input signal. Accordingly, the output square wave signal of the OR circuit 17 shown in FIG. 6 will have rises indicated by phantom lines in FIG. 7(A) which occur before or after rises which should actually occur as indicated by solid lines, because the outputs of delay circuits provided in different stages are selectively produced from the OR circuit 17 depending on which of the NAND circuits $16_1$ through $16_n$ are turned ON. Hence, in the present modification, measures are taken so that a square signal having a duty cycle which is accurately equal to 50% can be obtained even when the TTL gates are used for the delay circuits $12_1$ through $12_n$. In addition, according to the present modification, it is possible to obtain a square wave signal having a duty cycle which is other than 50%, depending on the setting of monostable multivibrators.

Figure 7:
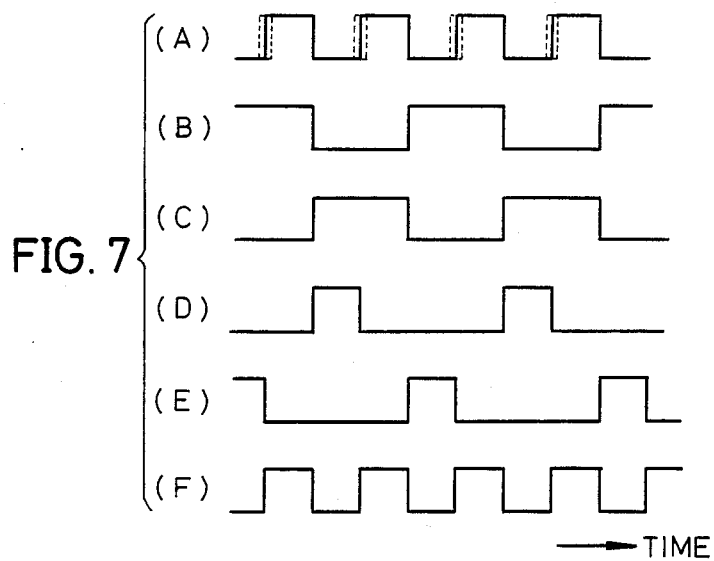
FIGS. 7(A) through 7(F) are graphs showing signal waveforms for explaining the operation of the circuit shown in FIG. 6.

The output square wave signal of the OR circuit 17, having the waveform shown in FIG. 7(A), is frequency divided by ½ in a flip-flop 31. A signal shown in FIG. 7(B) is obtained from a Q-output of the flip-flop 31, and a signal shown in FIG. 7(C) is obtained from a $\overline{Q}$-output of the flip-flop 31. The Q-output of the flip-flop 31 is supplied to a monostable multivibrator 32 so as to trigger this monostable multivibrator 32 responsive to a fall in this Q-output. Hence, the monostable multivibrator 32 produces a signal shown in FIG. 7(D). On the other hand, the $\overline{Q}$-output of the flip-flop 31 is supplied to a monostable multivibrator 33 so as to trigger this monostable multivibrator 33 responsive to a fall in the $\overline{Q}$-output. Thus, the monostable multivibrator 33 produces a signal shown in FIG. 7(E). The output signals of the monostable multivibrators 32 and 33 are supplied to a NOR circuit 34, and the NOR circuit 34 produces a square wave signal shown in FIG. 7(F). This square wave signal shown in FIG. 7(F) is obtained through the output terminal 18 as an output of the phase locked signal generator. According to the present modification, the output square wave signal of the OR circuit 17 is subjected to a wave-shaping by taking the fall in the output square signal of the OR circuit 17 as a reference. Therefore, even when the delay times in the delay circuits $12_1$ through $12_n$ slightly differ with respect to a rise and a fall in the respective input signals, it is possible to obtain through the output terminal 18 a square wave signal which has a duty cycle which is accurately equal to 50%.

In the modification described heretofore, the output square wave signal of the OR circuit 17 is subjected to the wave-shaping by taking the fall in the output square wave signal of the OR circuit 17 as the reference. However, the output square wave signal of the OR circuit 17 may be subjected to a wave-shaping by taking a rise in the output square wave signal of the OR circuit 17 as a reference. In this case, the connection between the latch circuits $13_1$ through $13_{n+1}$ and the AND circuits $15_1$ through $15_n$ in FIG. 1 may be changed so that a Q-output of a latch circuit $13_{i-1}$ and a $\overline{Q}$-output of a latch circuit $13_i$ are supplied to an AND circuit $15_{i-1}$, for example.

Next, description will be given with respect to a case where the phase locked signal generator according to the present invention is applied to a digital picture element information write-in and read-out system, by referring to a general block system shown in FIG. 8.

In FIG. 8, a composite video signal applied to an input terminal 41, is supplied to a synchronizing signal separating circuit 42 wherein a horizontal synchronizing signal and a vertical synchronizing signal are separated. An output video signal of the synchronizing signal separating circuit 42 is supplied to an analog-to-digital (A/D) converter 43 and is converted into a digital video signal. Data within the output digital video signal of the A/D converter 43 are successively supplied to latch circuits 44 through 47, and the latch circuits 44 through 47 write the data into RAMs 48 through 51 in terms of four data.

A phase locked signal generator 52 according to the present invention is supplied with the output horizontal synchronizing signal of the synchronizing signal separating circuit 42 as a reference signal. The phase locked signal generator 42 supplies a clock signal to a horizontal address counter 53 and to a read/write (R/W) controller 55. The address counter 53 counts pulses of the clock signal supplied thereto, and calculates a horizontal direction write-in address. This horizontal direction write-in address is supplied to the RAMs 48 through 51. The address counter 53 is reset responsive to the output horizontal synchronizing signal of the synchronizing signal separating circuit 42. On the other hand, the line counter 54 counts pulses of the output horizontal synchronizing signal of the synchronizing signal separating circuit 42, and calculates a vertical direction write-in address. This vertical direction write-in address is supplied to the RAMs 48 through 51. The line counter 54 is reset responsive to the output vertical synchronizig signal of the synchronizing signal separating circuit 42. The R/W controller 55 controls the write-in timing with respect to the RAMs 48 through 51, responsive to the output clock signal of the phase locked signal generator 52. In addition, the R/W controller 55 controls the signal conversion timing of the A/D converter 43.

The stored data are read out from the RAMs 48 through 51 in terms of four data under the control of the R/W controller 55, and are supplied to latch circuits 56 through 59. Similarly as at the time of the write-in, the horizontal and vertical direction addresses are designated by the respective counters 53 and 54 at the time of the read-out. Output data of the latch circuits 56 through 59 are supplied to a selector 60 in parallel, and the selector 60 supplies a serially converted data to a digital-to-analog (D/A) converter 61. An output video signal of the D/A converter 61 is obtained through an output terminal 62.

Accordingly, when the phase locked signal generator according to the present invention is applied to the digital picture element information write-in and read-out system, the write-in and read-out of data can be carried out with an extremely satisfactory accuracy, because the clock signal supplied to the R/W controller 55 is accurately phase locked to the horizontal synchronizing signal. For this reason, the recorded or reproduced picture will not become irregular in the horizontal direction of the picture for every horizontal scanning line.

Further, the present invention is not limited to these embodiments, but various variations and modifications may be made without departing from the scope of the present invention.

What is claimed is:

1. A phase locked signal generator for producing a square wave signal which is phase locked to a reference signal, said phase locked signal generator comprising:
   an asynchronous oscillator for producing a square wave signal;
   delay means supplied with the square wave signal from said asynchronous oscillator, said delay means comprising first through nth delay circuits which are coupled in series, where n is an integer, said asynchronous oscillator supplying the square wave signal to said first delay circuit;
   latch means responsive to said reference signal for simultaneously latching the square wave signal from said asynchronous oscillator and the output of said first through nth delay circuits, said latch means comprising first through (n+1)th latch circuits which are supplied with said reference signal and first through nth AND circuits which are supplied with outputs of said first through (n+1)th latch circuits, said first latch circuit latching the square wave signal from said asynchronous oscillator in response to said reference signal, an ith latch circuit latching an output of a (i−1)th delay circuit in response to said reference signal, a (i−1)th AND circuit being supplied with a $\overline{Q}$-output of a (i−1)th latch circuit and a Q-output of said ith latch circuit, where i is an arbitrary integer from 2 to n+1; and
   gate means supplied with the outputs of said first through nth delay circuits and outputs of the first through nth AND circuits, said gate means comprising first through nth NAND circuits and an OR circuit which is supplied with outputs of the first through nth NAND circuits, and a jth NAND circuit being supplied with outputs of a jth delay circuit and a jth AND circuit, where j is an arbitrary integer from 1 to n, said gate means passing an output of one of said first through nth delay circuits as an output square wave signal of the phase locked signal generator, said one of said first and nth delay circuits having an input and an output of mutually opposite polarities at a time when said reference signal is applied to the latch means.

2. A phase locked signal generator as claimed in claim 1 in which said first through nth delay circuits are made up of TTL gates, and said phase locked signal generator further comprises wave shaping means for subjecting an output square wave signal of the gate means to a wave-shaping by taking a rise or a fall in the output square wave signal of the gate means as a reference, so that the wave shaping means produces a square wave having a duty cycle which assumes a desired constant value.

3. A phase locked signal generator as claimed in claim 2 in which said wave shaping means comprises a flip-flop for frequency-dividing the output square wave signal of the gate means, a first monostable mutlivibrator triggered responsive to a fall in a Q-output of the flip-flop, a second monostable multivibrator triggered responsive to a fall in a $\overline{Q}$-output of the flip-flop, and means for obtaining a logical sum of outputs of the first and second monostable multivibrators.

4. A phase locked signal generator as claimed in claim 2 in which said wave shaping means comprises a monostable multivibrator which is triggered responsive to a rise or a fall in the output square wave signal of the gate means.

5. A phase locked signal generator as claimed in claim 1 in which said asynchronous oscillator is a crystal oscillator.

6. A phase locked signal generator as claimed in claim 1 in which said reference signal is a horizontal synchronizing signal within a reproduced signal which is obtained from a VTR, and the output square wave signal of said phase locked signal generator is used to generate write-in and read-out clock signals for a digital picture processing apparatus which is coupled to the VTR and performs write-in and read-out of digital picture element information in synchronism with the VTR.

7. A phase locked signal generator as claimed in claim 1 in which each of said first through nth delay circuits has a delay time $t_1$, and a total time T of the delay times $t_1$ in each of said first through nth delay circuits is set to a value which is larger than a period P of the square wave signal produced by said asynchronous oscillator.

8. A phase locked signal generator as claimed in claim 1 in which each of said first through nth delay circuits has a delay time $t_1$, each of said first through (n+1)th latch circuits has a latch delay time $t_2$, each of said first through nth AND circuits has a gate delay time $t_3$, a total time T $(=nt_1)$ of the delay times $t_1$ in each of said first through nth delay circuits is set to a value which is larger than a period P of the square wave signal produced by said asynchronous oscillator, and $t_1 = t_2 + t_3$.

9. A phase locked signal generator for producing a square wave signal which is phase locked to a reference signal, said phase locked signal generator comprising:

an asynchronous oscillator for producing a square wave signal;

delay means supplied with the square wave signal from said asynchronous oscillator, said delay means comprising first through nth delay circuits which are coupled in series, where n is an integer, said asynchronous oscillator supplying the square wave signal to said first delay circuit;

latch means supplied with the square wave signal from said asynchronous oscillator and output of said first through nth delay circuits, said latch means comprising first through nth AND circuits and first through nth latch circuits, an ith AND circuit producing an output when an input and an output of an ith delay circuit have mutually opposite phases, an ith latch circuit latching the output of said ith AND circuit in response to said reference signal, where i is an arbitrary integer from 1 to n; and gate means supplied with the outputs of said first through nth delay circuits and outputs of said first through nth latch circuits, said gate means comprising first through nth NAND circuits and an OR circuit which is supplied with outputs of the first through nth NAND circuits, and a jth NAND circuit being supplied with an output of a jth latch circuit and an output of a jth delay circuit, where j is an arbitrary integer from 1 to n, said gate means passing an output of one of said first through nth delay circuits as an output square wave signal of the phase locked signal generator, said one of said first through nth delay circuits having an input and an output of mutually opposite polarities at a time when said reference signal is applied to the latch means.

10. A phase locked signal generator as claimed in claim 9 in which each of said first through nth delay circuits has a delay time $t_1$, each of said first through nth latch circuits has a latch delay time $t_2$, each of said first through nth AND circuits has a gate delay time $t_3$, a total time T of the delay times $t_1$ in each of said first through nth delay circuits is set to a value which is larger than a period P of the square wave signal produced by said asynchronous oscillator, and $t_1 = t_2 + t_3$.

* * * * *